(12) United States Patent
Villalvazo et al.

(10) Patent No.: US 11,297,719 B2
(45) Date of Patent: Apr. 5, 2022

(54) TEMPLATE THAT IMPROVES SOLDER-PASTE STENCILING AND PRODUCTION METHOD THEREOF

(71) Applicant: INTERLATIN S DE RL DE CV, Jalisco (MX)

(72) Inventors: Jimmy Villalvazo, Mcallen, TX (US); Nestor Librado Castro Leyva, Jalisco (MX)

(73) Assignee: INTERLATIN S DE RL DE CV, Jalisco (MX)

( * ) Notice: Subject to any disclaimer, the term of this patent is extended or adjusted under 35 U.S.C. 154(b) by 0 days.

(21) Appl. No.: 16/639,743

(22) PCT Filed: Mar. 6, 2019

(86) PCT No.: PCT/MX2019/000024
§ 371 (c)(1),
(2) Date: Feb. 18, 2020

(87) PCT Pub. No.: WO2019/172742
PCT Pub. Date: Sep. 12, 2019

(65) Prior Publication Data
US 2020/0396844 A1 Dec. 17, 2020

(30) Foreign Application Priority Data
Mar. 7, 2018 (MX) .................... MX/a/2018/002858

(51) Int. Cl.
*B41N 1/24* (2006.01)
*H05K 3/12* (2006.01)

(52) U.S. Cl.
CPC ........... *H05K 3/1233* (2013.01); *B41N 1/242* (2013.01); *H05K 3/1225* (2013.01)

(58) Field of Classification Search
CPC ......... B41N 1/248; B41N 1/24; H05K 3/1225
USPC ....................................................... 101/127
See application file for complete search history.

(56) References Cited

U.S. PATENT DOCUMENTS 5,460,316 A     10/1995 Hefele
2011/0045238 A1  2/2011 Zeininger et al.

FOREIGN PATENT DOCUMENTS

CN       103223768 A  *  7/2013  ............... B41N 1/24
WO    WO2006062457       6/2006
WO    WO2007011567       1/2007

\* cited by examiner

*Primary Examiner* — Leslie J Evanisko
(74) *Attorney, Agent, or Firm* — CRGO Law; Steven M. Greenberg

(57) ABSTRACT

A template or stencil with perforations, which improves solder-paste stencilling on an object, includes: a first area treated with precision powder on a bottom laminar face of the template, the treated face covering at least an area where perforations are distributed; a second area treated with precision powder on a top laminar surface of the template, the second treated area encircling the perforations; and a third area treated twice with precision powder on the bottom laminar surface, the third area encircling the perforations of the template. A method for producing a template that improves solder-paste stencilling on an object is also provided, as is and to a method for the improved application of solder-paste on an object, such as a printed circuit board.

14 Claims, 13 Drawing Sheets

Figura 5

Figura 6

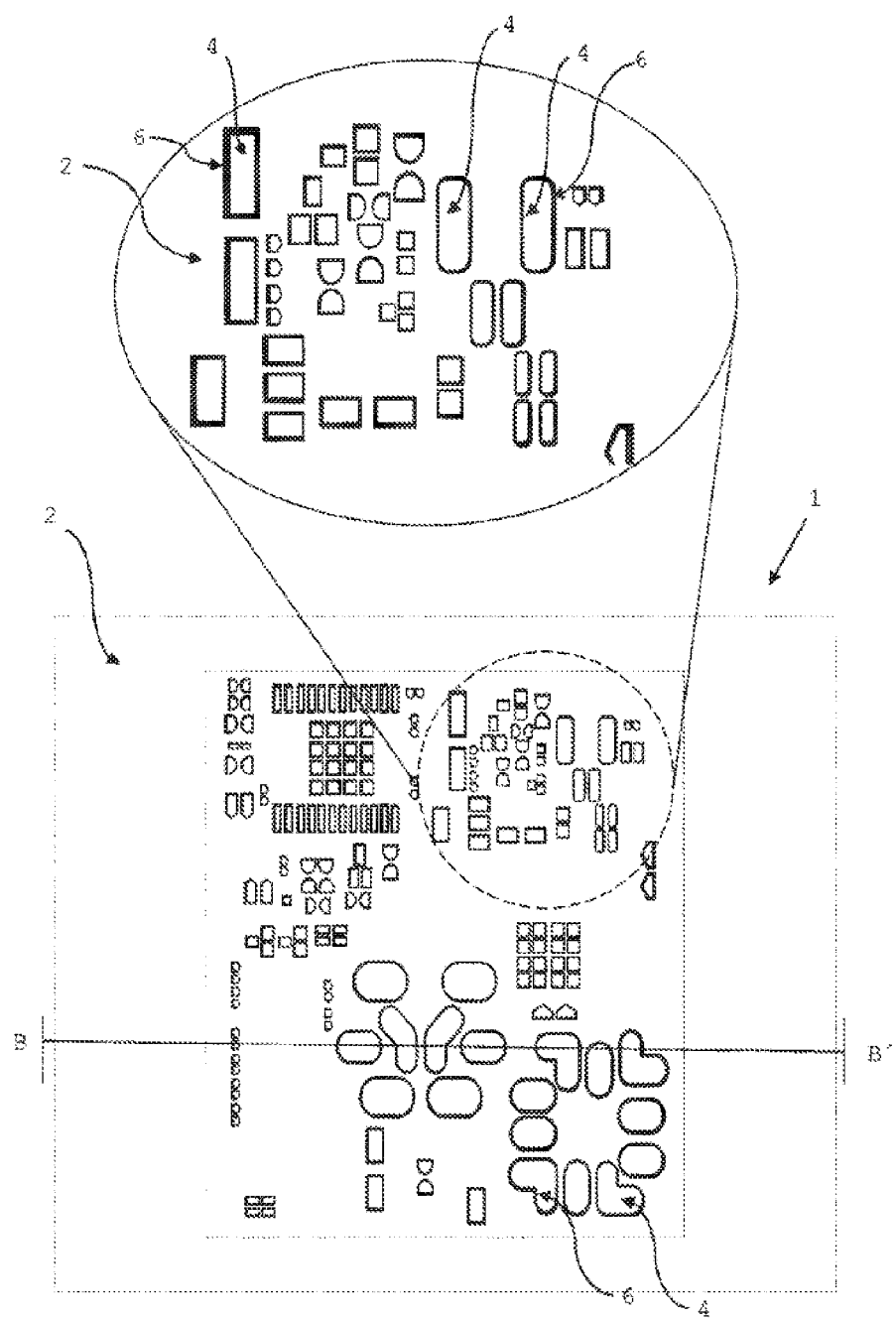
Figura 10

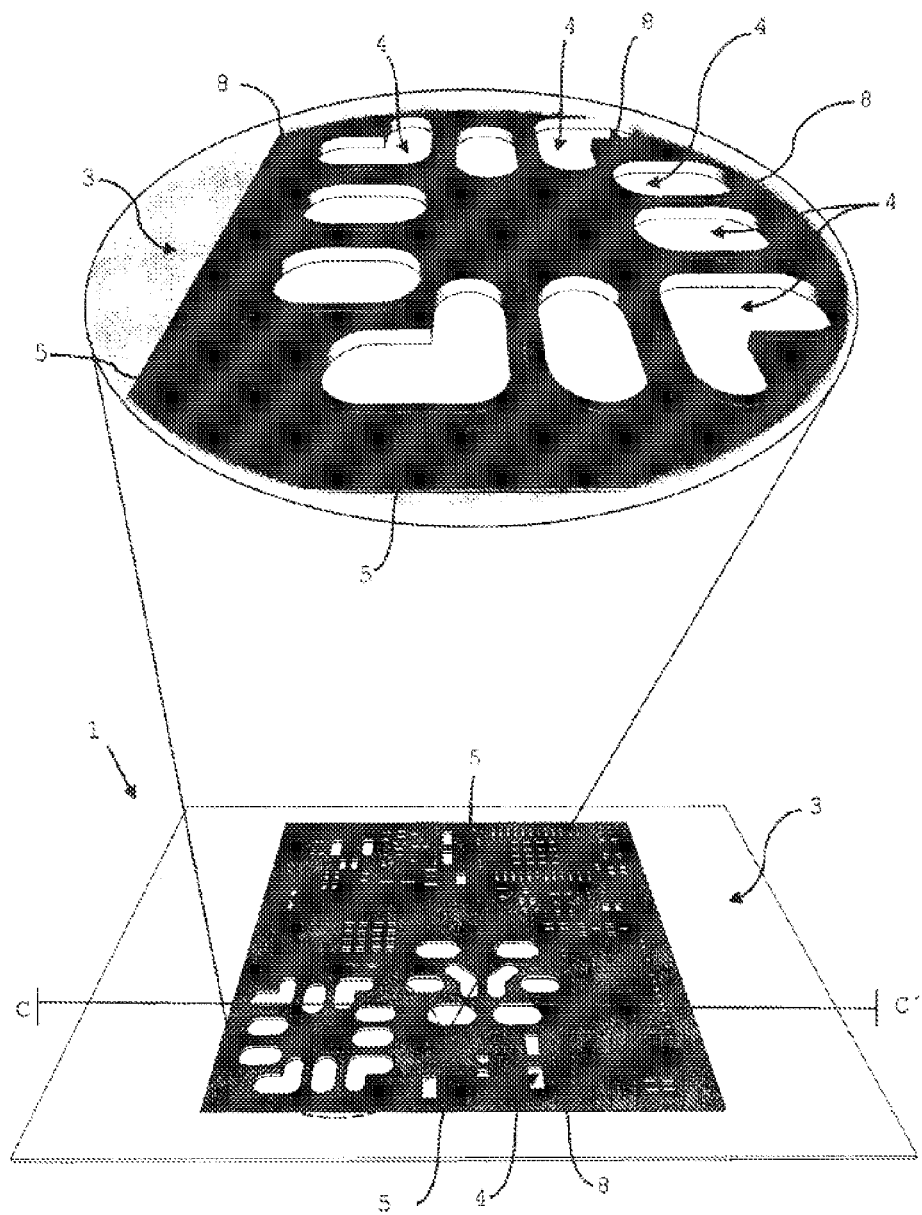
Figura 11

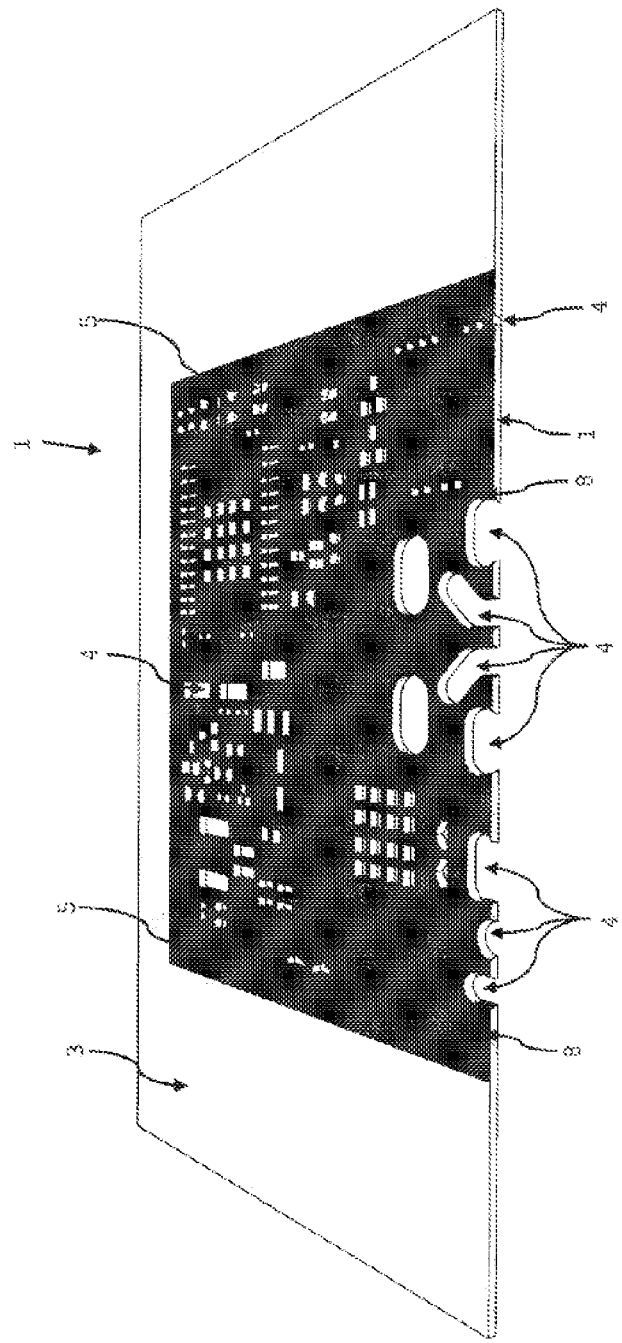
Figura 12

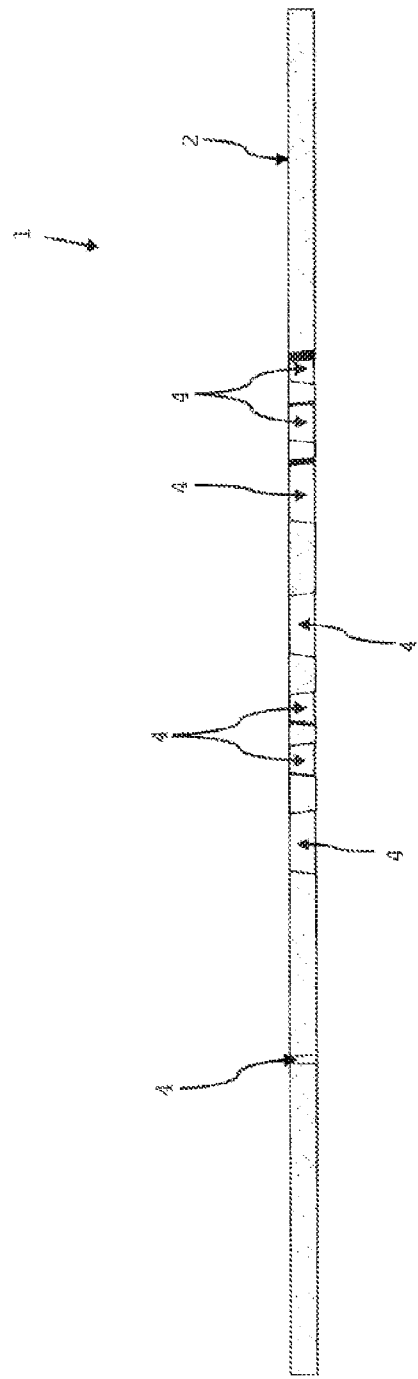

ized by non-limiting examples and figures, wherein:
TEMPLATE THAT IMPROVES SOLDER-PASTE STENCILING AND PRODUCTION METHOD THEREOF

TECHNICAL FIELD OF THE INVENTION

The present invention relates to the technical field of Chemistry, Mechanics and Electronics, specifically in the manufacturing processes of templates useful in solder-paste stencilling; as a result it provides a template which improves solder-paste stencilling, particularly in solder-paste stencilling on printed circuit boards. Therefore, the present invention also provides a method for manufacturing the said template which improves solder-paste stencilling: as well as a method which improves the application of solder-paste.

BACKGROUND OF THE INVENTION

Currently, one of the main defects in the assembly processes of printed circuit boards (PCBs) is due to the poor applications of solder-paste on the said boards, for example, the Surface Mount Technology Association (SMTA) reports up to 70% of defects in PCB manufacturing processes, caused by solder-paste.

These defects are further aggravated due to the growing need for the use of increasingly smaller denser electronic cards (nano or miniaturisation), etc., so the challenge of achieving more efficient processes to reduce these defects or problems continues.

Within the deficiencies of the applications of solder-paste on printed circuit boards, one of the challenges to be achieved is to maintain adequate and repeatable solder-paste volume when the size of the template or stencil openings are very small, especially when they are below the minimum area ratio (Area Ratio) and aspect ratio (Aspect Ratio) indices; where the value of the area ratio index is >0.66, and the value of the aspect ratio index is >1.5.

In this regard, technologies based on the coating of the stencils or templates have been developed, in order to improve their non-stick properties against SMT solder-paste. However, to date, these technologies, including nano or miniaturisation, are still poor, because paste solder volumes are not adequate. or repeatable when the size of the template or stencil openings are below the limits of the values of the area ratio (Area Ratio) and aspect ratio (Aspect Ratio) indices; and in addition, the said coatings have very little durability because they peel off and/or wear out in just 2 or 3 weeks, according to the type of maintenance given to such stencils and/or templates.

That is why, in order to counteract the aforementioned drawbacks, a template or stencil has been developed which improves solder-paste stencilling, it especially improves solder-paste stencilling on electronic circuit boards; likewise, a method has been developed for the manufacture of the said template or stencil which improves solder-paste stencilling; and also in addition, a method has been developed for an improved application of solder-paste on printed circuit boards.

BRIEF DESCRIPTION OF THE DRAWINGS

The additional features and advantages of the present invention are more clearly understood in the following detailed description of the preferred embodiments thereof, given by means of non-limiting examples and figures, wherein:

FIG. 10 is a top level view of the template of the present invention, where a detail of a second treated area surrounding the perforations of the said template is observed.

FIG. 11 is a bottom perspective view of the template according to the present invention, where a detail is observed the first and third treated areas, where the third treated area surrounds only the perforations.

FIG. 12 shows a bottom perspective view of a C-C' sagittal section of the template according to the present invention, where its treated areas are observed.

FIG. 13 is the B-B' sagittal section of the treated template, according to the present invention.

DETAILED DESCRIPTION OF THE INVENTION

Figure 1:
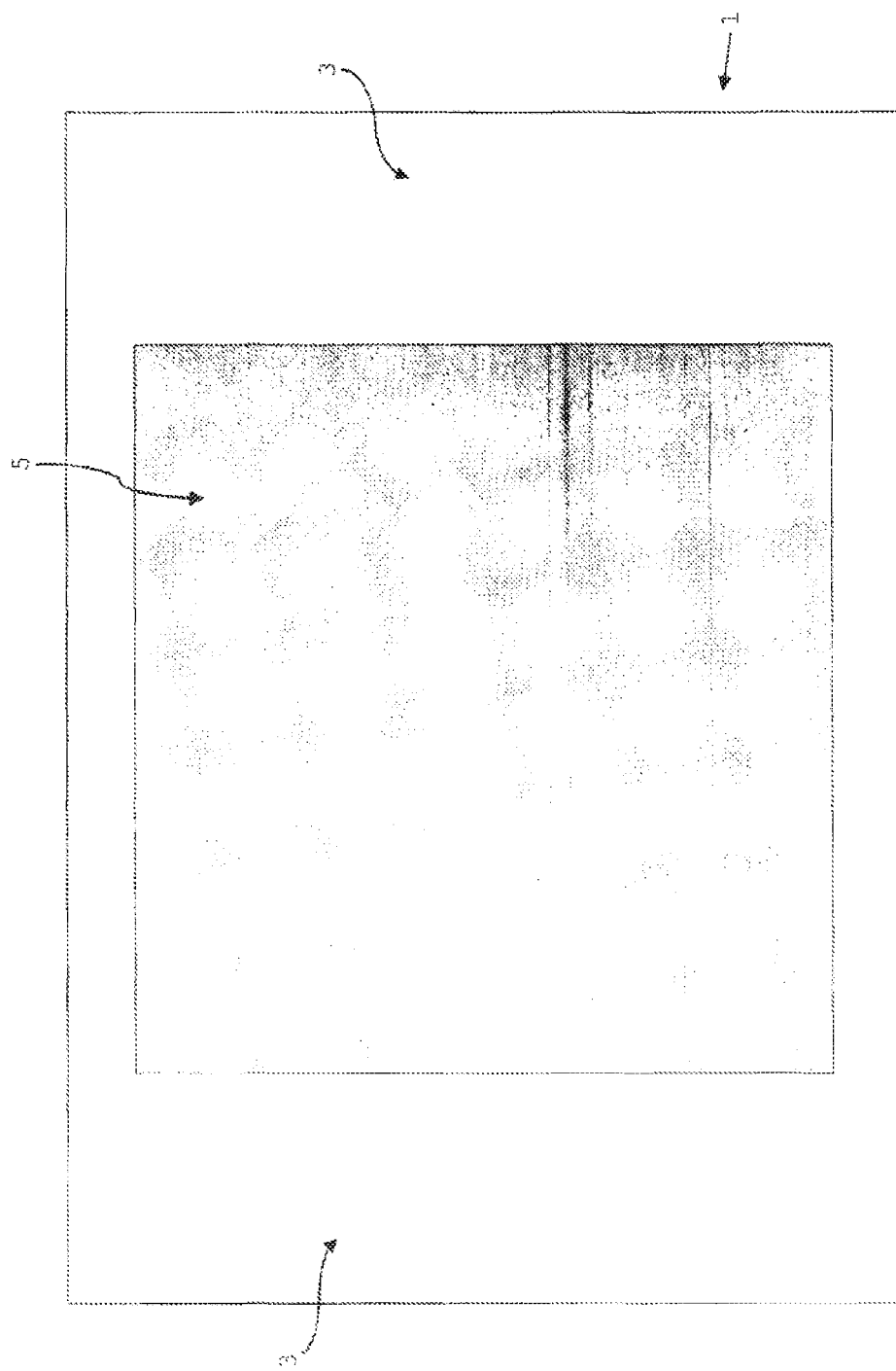
FIG. 1 is a bottom level view of the template which improves the solder-paste state, in objects, of the present invention, where a first treated area is observed.
Figure 2:
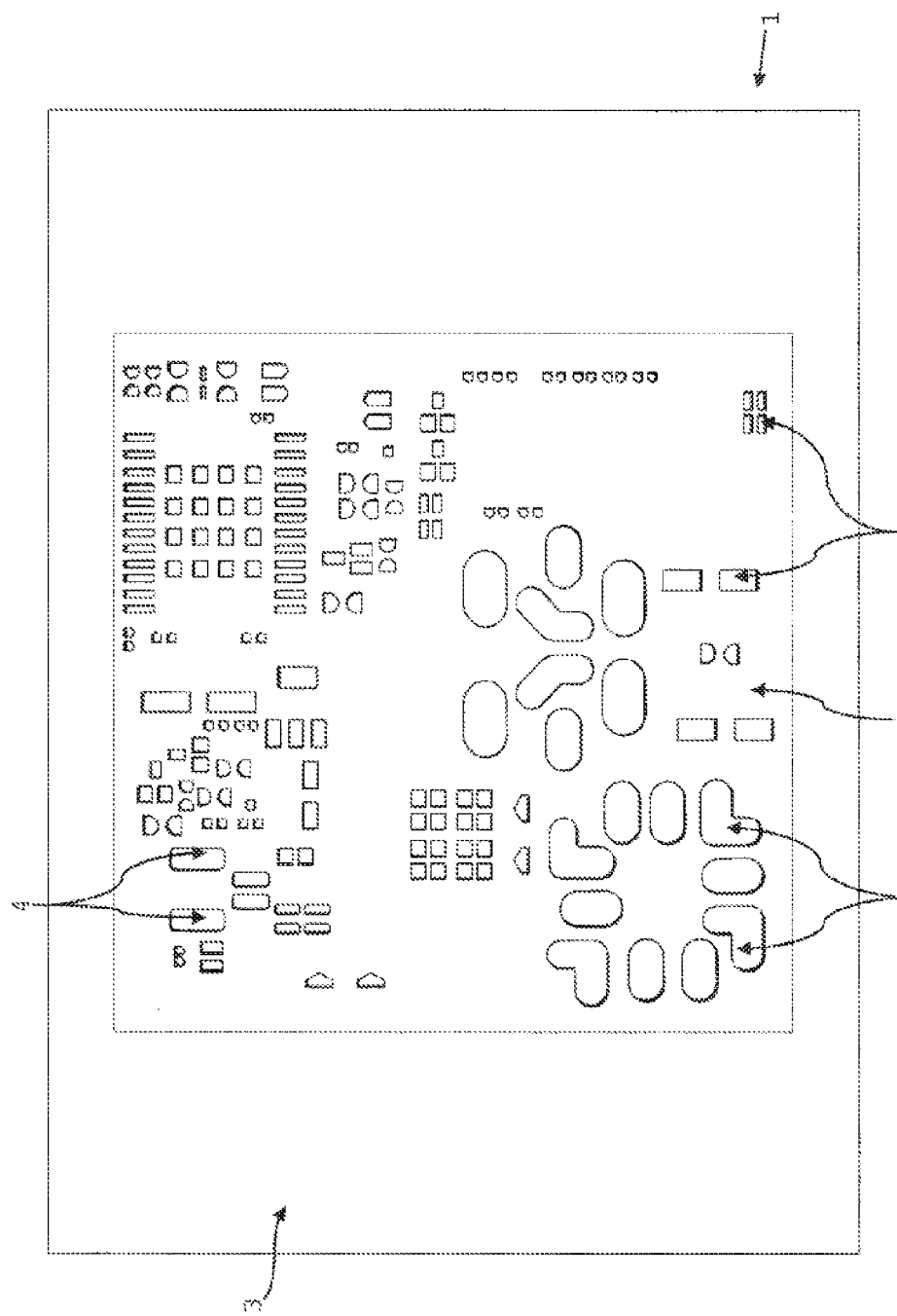
FIG. 2 is a bottom level view of the template of the previous figure, with the perforations made.
Figure 3:
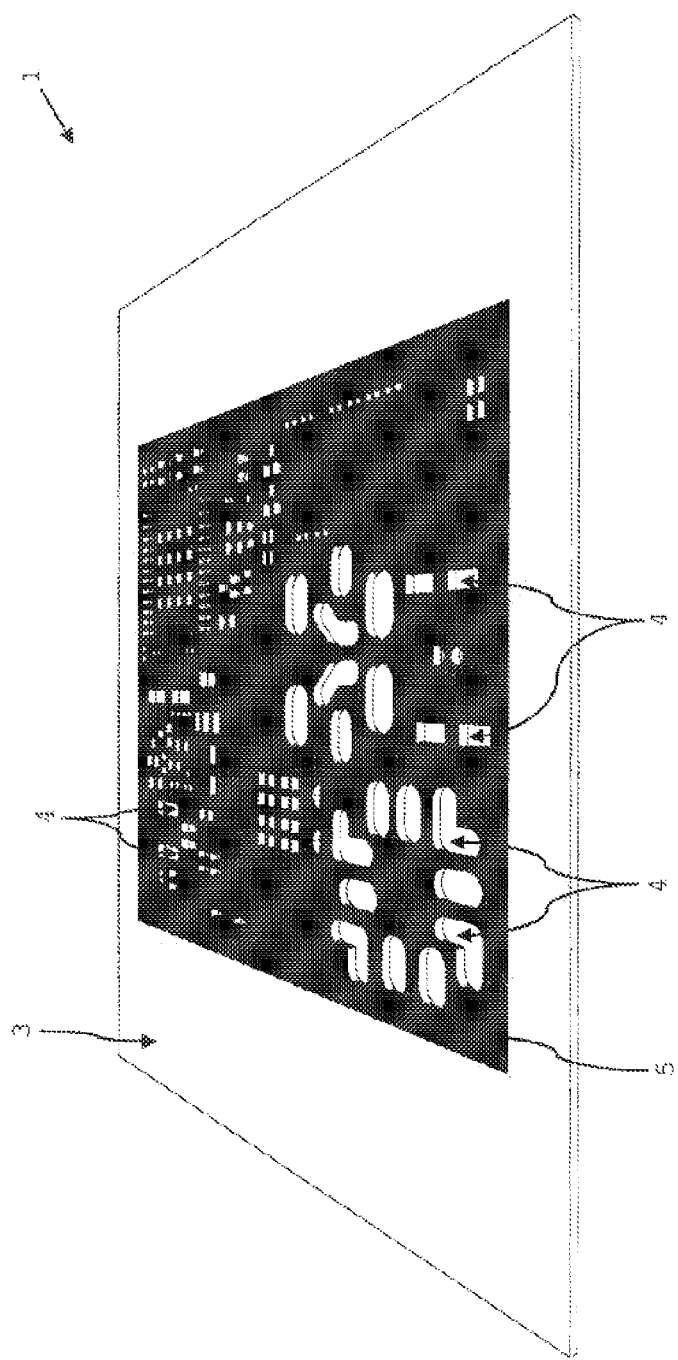
FIG. 3 is a bottom perspective view of the template in the previous figure.
Figure 4:
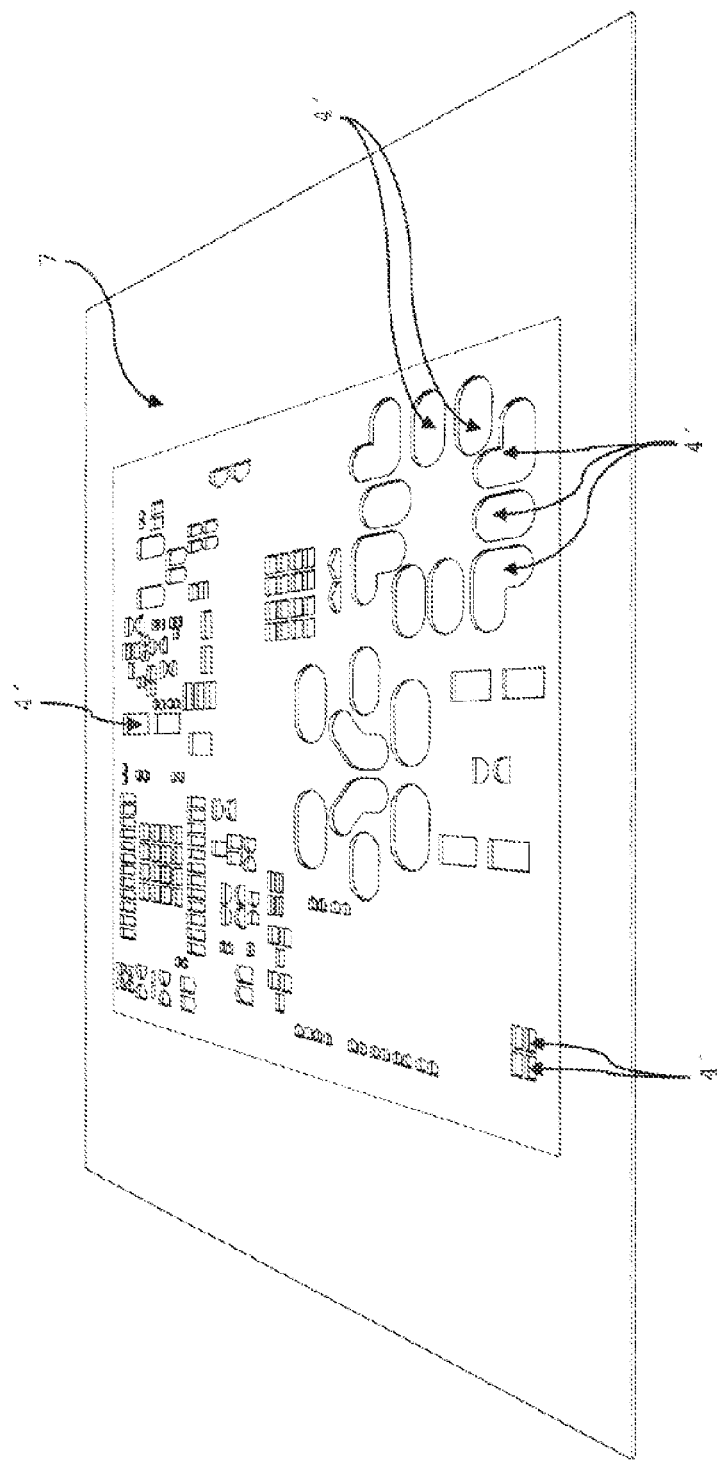
FIG. 4 is a conventional perspective view of a template-mask, useful as a tool in the treatment of the template of the present invention.
Figure 5:
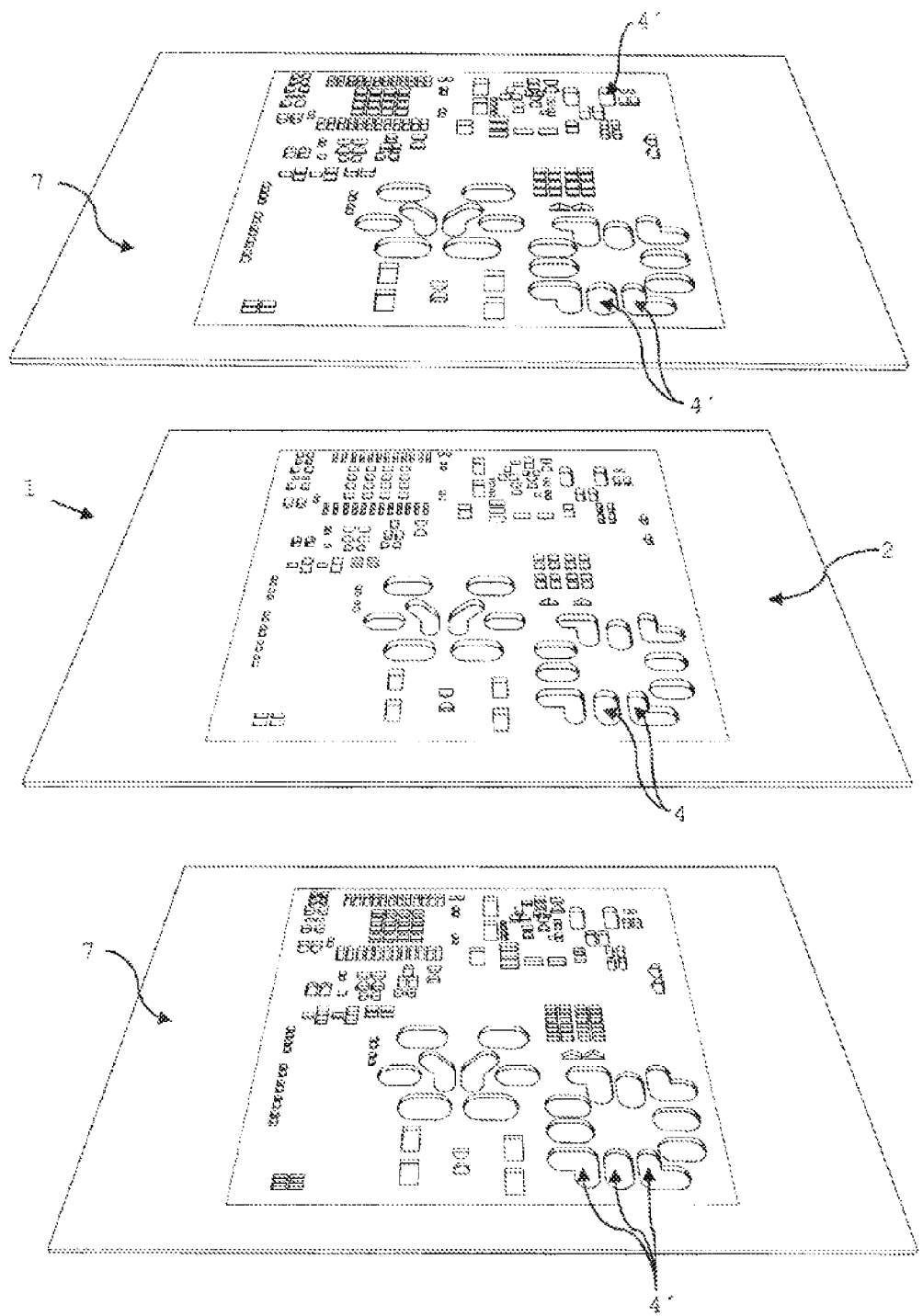
FIG. 5 is an exploded view of the top part of a combination of the template in question, between two templates-masks.
Figure 6:
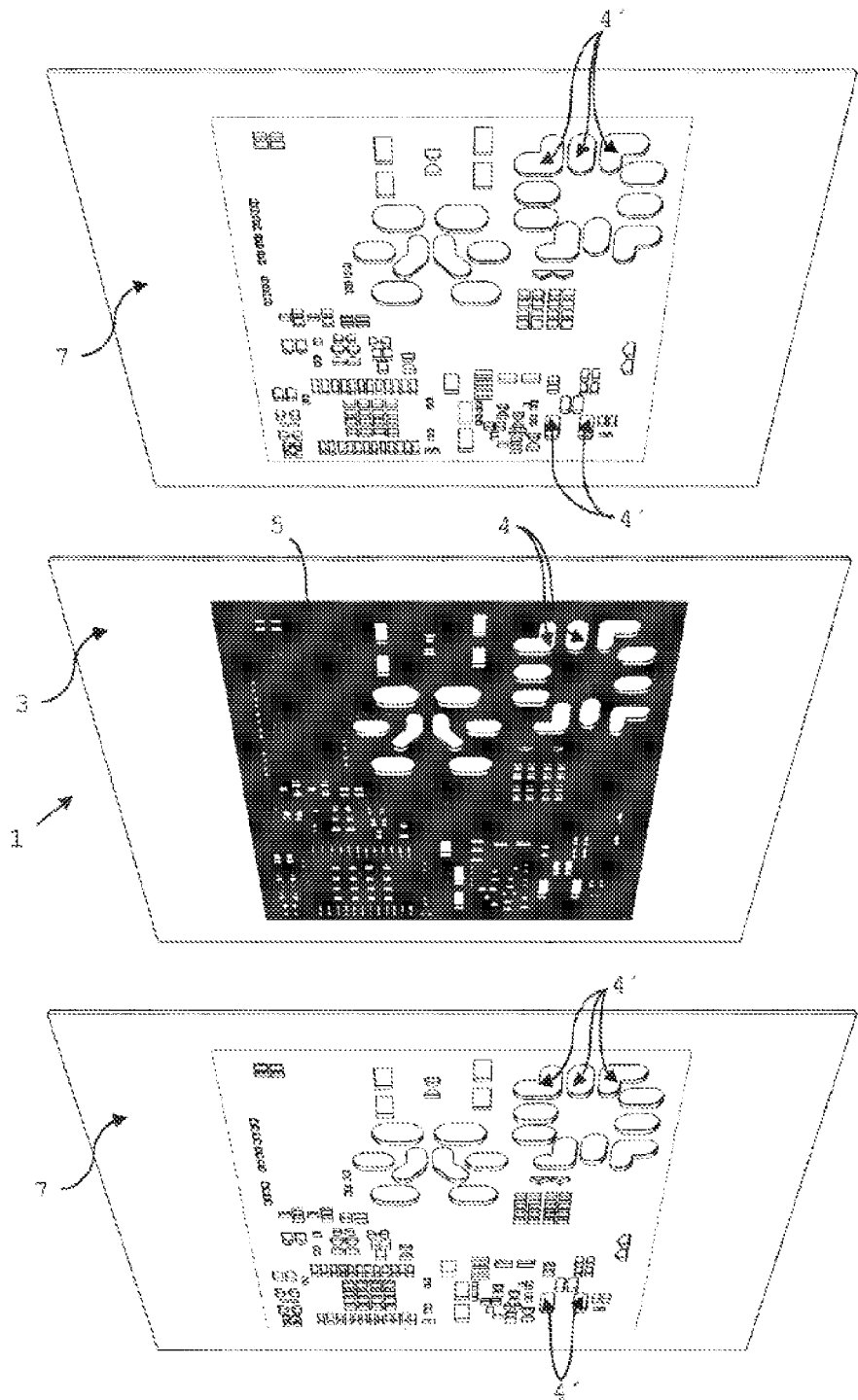
FIG. 6 is a bottom exploded view of the combination of the template in question, between two templates-masks.
Figure 7:
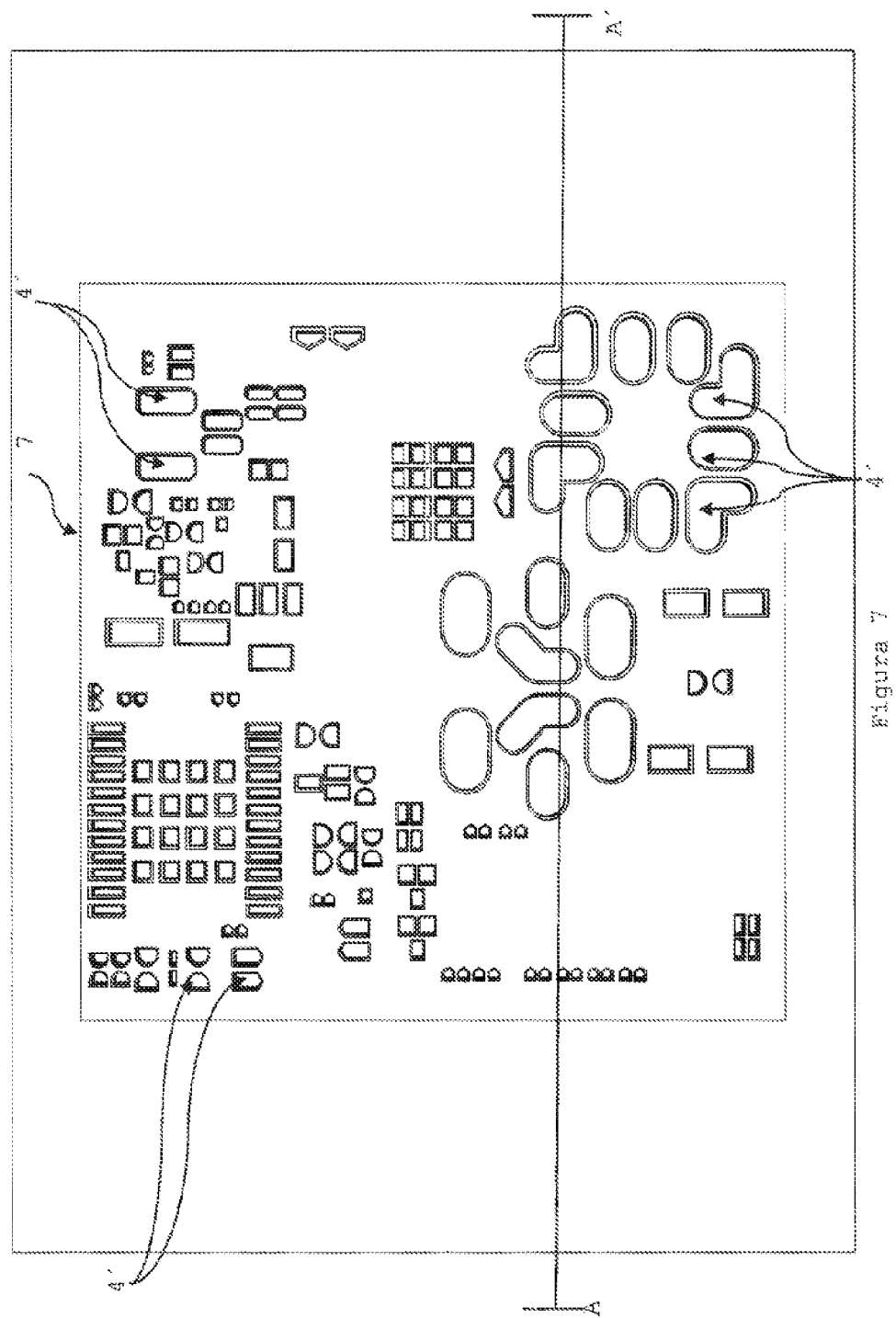
FIG. 7 is a top level view of the combination of the template in question, between two stencils-masks, where the way of joining them is observed.
Figure 8:
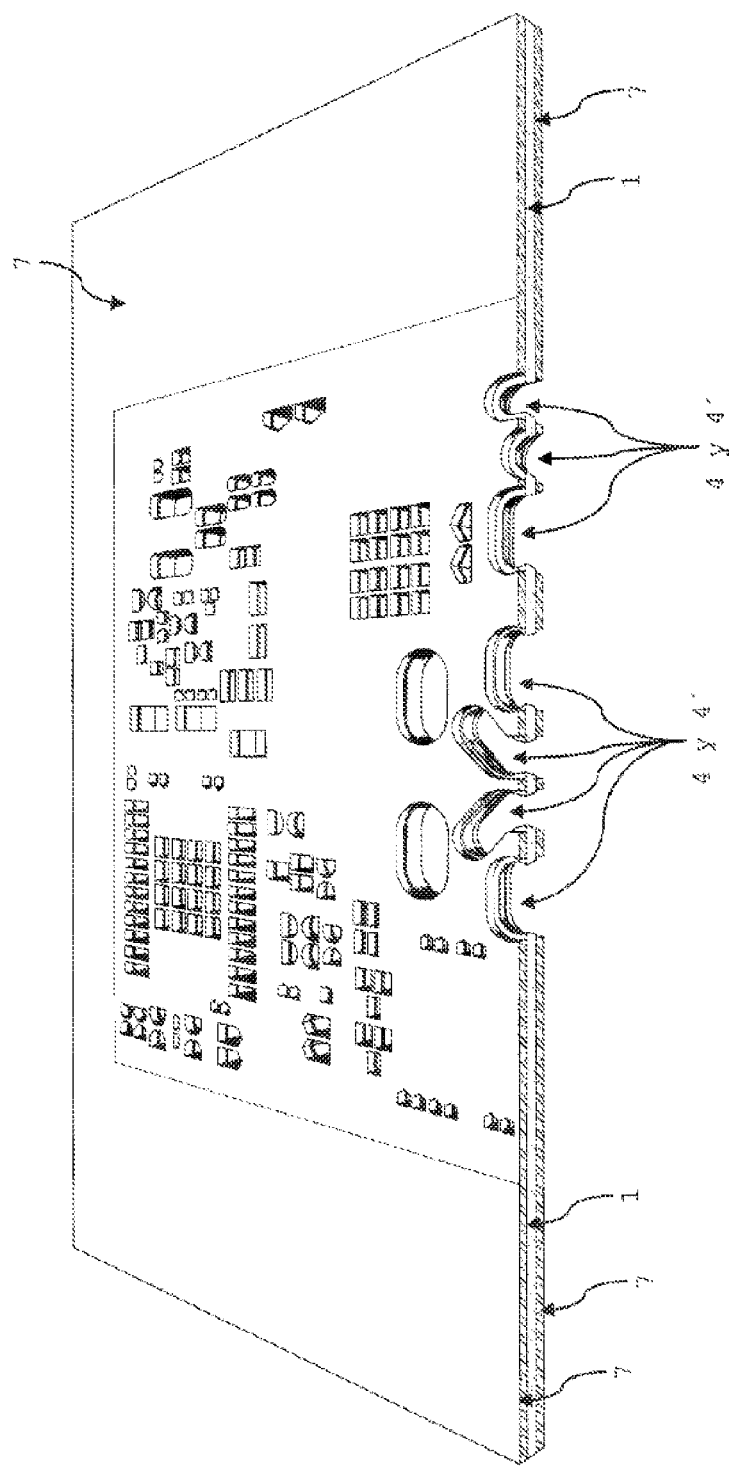
FIG. 8 is a top perspective view of an A-A" sagittal section, where the union of the combination of the template in question is observed, between the two templates-masks.
Figure 9:
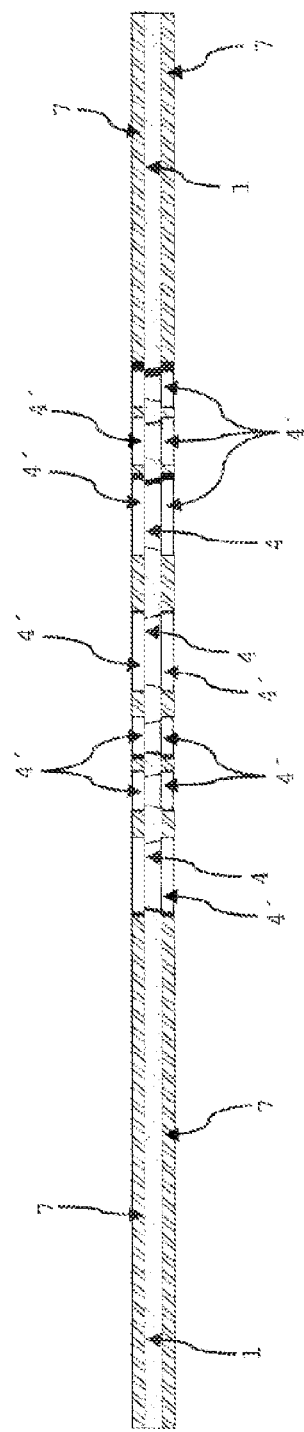
FIG. 9 is the A-A' sagittal section of the combination of the template combination of the previous figure.

One of the purposes of the present invention is a template or stencil which improves solder-paste stencilling in objects; where the said objects can be a printed circuit board, electronic card, electronic tablet or printed circuit tablet, among similar items.

It should be noted that the term "template" in this description, should be understood in a broad sense, including all those expressions which refer to the same or are similar, such as: stencil, sheet, lamella, mask, small mask, to quote some examples.

The template (1) which improves solder-paste stencilling in an object, in accordance with the present invention, has a top laminar face (2), a bottom laminar face (3), and perforations (4); and its features comprise:

i) a first area (5) treated with a precision powder treatment, on its bottom laminar face (3); where said treated area (5) covers at least, the area where the perforations (4) are distributed;

ii) a second area (6) treated with a treatment with a precision powder: on its top laminar face (2), where the said treated area (6) surrounds only the perforations (4); and iii) a third area (8) treated with two treatments with a precision powder, on its bottom sheet face (3), where the said treated area (8) surrounds only the perforations (4) of the laminar template (1).

The precision powder can be that powder which provides beneficial properties to the template (1) to improve the application of solder-paste, for example, aluminium oxide; where it should preferably have a particle size of about 10 microns.

One embodiment of the template (1) is when the second (6) and third (8) treated areas should preferably have a surface of $12.7\mu^2$ around each perforation (4).

The present invention also comprises a method for manufacturing a template which improves solder-paste stencilling; the said method comprises the following steps:
i) defining an area (5) where the perforations (4) will be made, on the bottom sheet face of the template (1);
ii) treating the area (5) where the perforations will be made (4), by applying a precision powder to it under pressure, thus obtaining a first area (5) treated with a single treatment;
iii) polishing the first treated area (5);
iv) making the perforations (4) with a laser beam device, in the first treated area (5); where the said perforations (4) are previously designed and validated;
v) polishing the cuts at the edges of the perforations (4), until smooth.
vi) treating an area around each perforation (4) on both laminar sides (2 and 3) of the template (1), applying a precision powder under pressure on the said area; thus generating a second area (6). treated with a single treatment, which surrounds the perforations (4) on the top face (2), and a third area (8), treated with a double treatment, which surrounds the perforations on the bottom face (3) of the template (1); and
vii) checking that the second (6) and third (8) treated areas surrounding the perforations (4) are present in. at least 85%.

One embodiment of the method for manufacturing a template which improves the solder-paste stencilling, according to the present invention, is when the precision powder is aluminium oxide; and has a particle size of at least 10 microns.

One embodiment of the method in question is to apply the precision powder at a pressure of 104 psi for 10 min.

One further embodiment of the present method is when the treated area (5) and the cuts of the edges of the perforations (4) are polished for 10 s.

A preferred manner of how to carry out stage vi) of the method in question, is to place a template-mask (7) on each laminar face (2 and 3) of the template (1); where the said template-mask (7) has a pattern of perforations (4') exactly equal to the perforation pattern (4) of the template (1), but the perforations (4') of the template (7) have a larger area by $25.4\mu^2$, preferably; so the perforations (4) of the template (1) must be properly centred in the area of the perforations (4') of the templates-masks (7), so that the profiles (4') leave an exposed surface which concentrically circumscribe the edge of the perforations (4), where the exposed surface is preferred to be $12.7\mu^2$ around each perforation (4) of said template (1).

Therefore, the second (6) and third (8) treated areas, have an area of $12.7\mu^2$ around each perforation (4).

In this way a template (1) or stencil which improves the solder-paste stencilling in an object, such as on a printed circuit board is maintained. since it is possible to maintain a volume of solder-paste, adequate and repeatable, even when the size of the openings of the template or stencil are very small, especially when they are below the minimum values of the area ratio (Area Ratio) and aspect ratio (Aspect Ratio) indices. Obtaining the following advantages:

The template can be washable, since it does not have a coating which can be detached, as is the case with conventional stencils.
Useful in the application of solder-paste.
Reduces application times of solder-paste.
Reduces waste solder-paste.
Mechanical and electrical failures in the printed circuit board, stencilling with solder-paste, are minimised.
Increases the ICT performance from 60 to 75%.
Excellent solder-paste release.
Problems in printing processes of printed circuit boards are reduced.
The life of use of the template (1) is extended.
The consumption of consumables is reduced.
Productivity is increased.

On the other hand, the present invention also has as its object a method for the efficient application of solder-paste in an object, this method features comprising:
i) inserting a template (1) which improves the solder-paste stencilling on an object, as has been conceived in the present invention, on the object to be coated with solder-paste. previously designed;
ii) applying solder-paste on the object; and
iii) removing the template (1) from the object.

One embodiment of the method for the efficient application of solder-paste to an object is when the object is a printed circuit board.

The invention claimed is:

1. A template which improves the solder-paste stencilling in an object, comprising a top laminar face, a bottom laminar face, and one or more perforations, the template further comprising:
   i) a first treated area with a precision powder treatment on the bottom laminar face, wherein the first treated area covers an area where the one or more perforations are distributed;
   ii) a second treated area with a precision powder treatment on the top laminar face, wherein the second treated area surrounds the one or more perforations; and
   iii) a third treated area with two treatments with a precision powder on the bottom laminar face, wherein the third treated area surrounds the one or more perforations of the template.

2. The template of claim 1, wherein the precision powder treatment is aluminium oxide.

3. The template of claim 2, wherein the aluminium oxide has particles of about 10 microns.

4. The template of claim 1, wherein the second treated area and the third treated area have a surface area of 25.4 µ2 around each of the one or more perforations.

5. The template of claim 1, wherein the object is a printed circuit board.

6. A method for manufacturing a template that improves solder-paste stencilling, comprising:
   i) defining an area where one or more perforations will be made in a bottom laminar face of the template;
   ii) treating the area with a precision powder under pressure to yield a first treated area;
   iii) polishing the first treated area;
   iv) making the one or more perforations with a laser beam device on the first treated area, wherein the one or more perforations are designed and validated, previously;
   v) polishing cuts of borders of the one or more perforations, until they are smooth;
   vi) treating an area around each of the one or more perforations on a top laminar face and a bottom laminar face of the template, applying precision powder on the area to generate a second treated area with a single treatment, which surrounds the one or more perforations on the top laminar face, and a third treated area with double treatment, which surrounds the one or more perforations on the bottom laminar face of the template; and vii) checking that the second and third treated areas, surrounding the perforations are present in at least 85%.

7. The method of claim 6, wherein the precision powder is aluminium oxide.

8. The method of claim 7, wherein the aluminium oxide has particles of at least 10 microns.

9. The method of claim 7, wherein the application of the precision powder is at a pressure of 104 psi for 10 min.

10. The method of claim 7, wherein the first treated area and the edge cuts of the perforations are polished for 10 seconds.

11. The method of claim 7, wherein step vi) is performed by placing a template-mask on each laminar face of the sheet template; wherein the said template-mask has a perforation pattern exactly equal to the one or more perforations and the one or more perforations of the template have a larger area so that the one or more perforations of the template are perfectly centered in the area of the one or more perforations of the templates-masks in such a way that the one or more perforations expose a surface which concentrically surrounds the edge of the one or more perforations.

12. The method of claim 11, wherein the area of the perforations of the template-mask is greater by 25.4 µ2, compared to the perforations of the template.

13. The method of claim 11, wherein the exposed surface which concentrically surrounds the perforations is 25.4 µ2 around each perforation.

14. The method of claim 6, wherein the second and third treated areas have a surface area of 12.7 µ2 around each perforation.

* * * * *